US009729167B2

(12) United States Patent
Lagneau et al.

(10) Patent No.: US 9,729,167 B2
(45) Date of Patent: Aug. 8, 2017

(54) SYSTEM AND METHOD FOR CONVERSION OF NUMERIC VALUES BETWEEN DIFFERENT NUMBER BASE FORMATS, FOR USE WITH SOFTWARE APPLICATIONS

(71) Applicant: ORACLE INTERNATIONAL CORPORATION, Redwood City, CA (US)

(72) Inventors: Olivier Lagneau, Voreppe (FR); Joseph Darcy, Redwood City, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 154 days.

(21) Appl. No.: 14/504,288

(22) Filed: Oct. 1, 2014

(65) Prior Publication Data

US 2015/0095387 A1   Apr. 2, 2015

Related U.S. Application Data

(60) Provisional application No. 61/885,366, filed on Oct. 1, 2013.

(51) Int. Cl.
*G06F 5/00* (2006.01)
*H03M 7/02* (2006.01)
*H03M 7/24* (2006.01)

(52) U.S. Cl.
CPC .............. *H03M 7/02* (2013.01); *H03M 7/24* (2013.01)

(58) Field of Classification Search
None
See application file for complete search history.

(56) References Cited

U.S. PATENT DOCUMENTS 7,216,138 B2 *   5/2007   Abdallah ............... H03M 7/24
                                                                  708/204
9,395,981 B2 *   7/2016   Gschwind ........... G06F 9/30025
(Continued)

OTHER PUBLICATIONS

Gay, Correctly Rounded Binary-Decimal and Decimal-Binary Conversions, Nov. 30, 1990, 17 pages, AT&T Bell Laboratories, Murray Hill, New Jersey.
(Continued)

*Primary Examiner* — David H Malzahn
(74) *Attorney, Agent, or Firm* — Tucker Ellis LLP

(57) ABSTRACT

Described herein are systems and methods for conversion of numeric values between different number base formats, for use with software applications. In accordance with an embodiment, an integral part of a passed floating-point numeric value in a source number base (e.g., binary) format is isolated and converted to an integer. A fractional part of the numeric value is also isolated and converted to an integer, while limiting the isolation and conversion of the fractional part to a required precision or number of digits, depending on the particular requirements of a software application. The fractional part can be rounded, including determining an exact roundoff as appropriate, and if necessary propagating the rounding to the integral part. Digits from the resulting integers representing the integral and fractional parts can then be collected and used to prepare a representation of the original numeric value in a target number base (e.g., decimal) format.

27 Claims, 8 Drawing Sheets

(56) References Cited

U.S. PATENT DOCUMENTS

2012/0089655 A1* 4/2012 Erinjippurath .......... G06F 8/447
708/204
2015/0095387 A1* 4/2015 Lagneau ................. H03M 7/02
708/204

OTHER PUBLICATIONS

Shewchuk, Adaptive Precision Floating-Point Arithmetic and Fast Robust Geometric Predicates, Oct. 1, 1997, 59 pages, Discrete & Computational Geometry 18, 3, School of Computer Science, Carnegie Mellon University, Pittsburgh, PA.
Steele, Jr., et al., How to Print Floating Point Numbers Accurately, 2003, pp. 372-389, ACM/SIGPLAN Conference on Programming Language Design and Implementation.

* cited by examiner

SYSTEM AND METHOD FOR CONVERSION OF NUMERIC VALUES BETWEEN DIFFERENT NUMBER BASE FORMATS, FOR USE WITH SOFTWARE APPLICATIONS

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

CLAIM OF PRIORITY

This application claims the benefit of priority to U.S. Provisional application titled "SYSTEM AND METHOD FOR BINARY TO DECIMAL CONVERSION OF NUMERIC VALUES FOR USE WITH SOFTWARE APPLICATIONS", Application No. 61/885,366, filed Oct. 1, 2013, which application is herein incorporated by reference.

FIELD OF INVENTION

Embodiments of the invention are generally related to computer systems and software, and are particularly related to systems and methods for conversion of numeric values between different number base formats, for use with software applications.

BACKGROUND

Within a typical computer system, a common task is the conversion of data between different number bases, for example between base-2 (binary) and base-10 (decimal) representations.

Although human users are familiar with decimal numbering, computers generally store numeric values (e.g., integer or floating-point values) in binary format. Such numeric values understood by the computer in their binary format must generally be converted to a corresponding decimal representation before they can be presented within a software application (for example, a business application) that is designed for access by a user.

However, an issue commonly arises with numeric values that include fractions. While integers can be exactly represented in any number base, fractions generally cannot. For example, the fraction 1/10 can be exactly represented in decimal (as 0.1), but cannot be exactly represented in binary, and instead must be converted to a binary approximation (i.e., 0.00011 . . . ). Similarly, although the fraction 1/3 can be exactly represented in base-3 (as 0.1), it cannot be exactly represented in decimal, and must likewise be converted to a decimal approximation (i.e., 0.33333 . . . ).

Computer systems typically address this issue by converting binary format numeric values to human-readable decimal approximations that are inexact representations of the original values, but are of sufficient precision for their intended use. For example, in a Java environment, floating-point data can be represented using the IEEE Standard for Floating-Point Arithmetic (IEEE 754) as binary double values, which are then converted to decimal—possibly inexactly—for display purposes. Software applications can then present the converted values to end-users, or store them as textual data, using their human-readable decimal representations.

The decimal representation ultimately provided by the computer system may depend on the target locale associated with a particular software application. For example, the United States of America and India each recognize different schemes to represent large numbers, such as inserting grouping characters (e.g., spaces or commas) at different locations within the number. Other examples of locale-specific differences include the various sets of characters used to represent digits. As such, business applications intended for use in different countries may be required to represent their numbers accordingly.

Generally, when a floating-point value is to be represented in a human-readable form, the system can convert the value's binary format to a decimal representation, which in some environments can be implemented within a software library as a decimal-to-ascii ("dtoa") function. Using such a process, each decimal digit of the human-readable form is extracted from the binary format representation, in a one-by-one manner, using mathematical polynomial properties of the binary and decimal representations. Different mechanisms for converting between binary and decimal formats can be used, depending on the particular goals desired. Examples include (a) use of a fixed total number of digits chosen ahead of time; (b) use of a fixed number of digits to the right of the decimal point; (c) use of just enough digits to recover the original value (which is the default output mechanism in Java); or (d) use of as many digits as needed to output the exact numerical result (which can be up to several hundred places).

However, this process of conversion can be computationally expensive. Additionally, preparing the final decimal representation for use with a particular target locale may necessitate a further conversion, from an initial textual representation provided by a dtoa function, to the ultimate representation required by the target locale, requiring yet further computation.

The above are some examples of the types of environments in which embodiments of the invention can be used.

SUMMARY

Described herein are systems and methods for conversion of numeric values between different number base formats, for use with software applications. In accordance with an embodiment, an integral part of a passed floating-point numeric value in a source number base (e.g., binary) format is isolated and converted to an integer. A fractional part of the numeric value is also isolated and converted to an integer, while limiting the isolation and conversion of the fractional part to a required precision or number of digits, depending on the particular requirements of a software application. The fractional part can be rounded, including determining an exact roundoff as appropriate, and if necessary propagating the rounding to the integral part. Digits from the resulting integers representing the integral and fractional parts can then be collected and used to prepare a representation of the original numeric value in a target number base (e.g., decimal) format.

DETAILED DESCRIPTION

Figure 1:
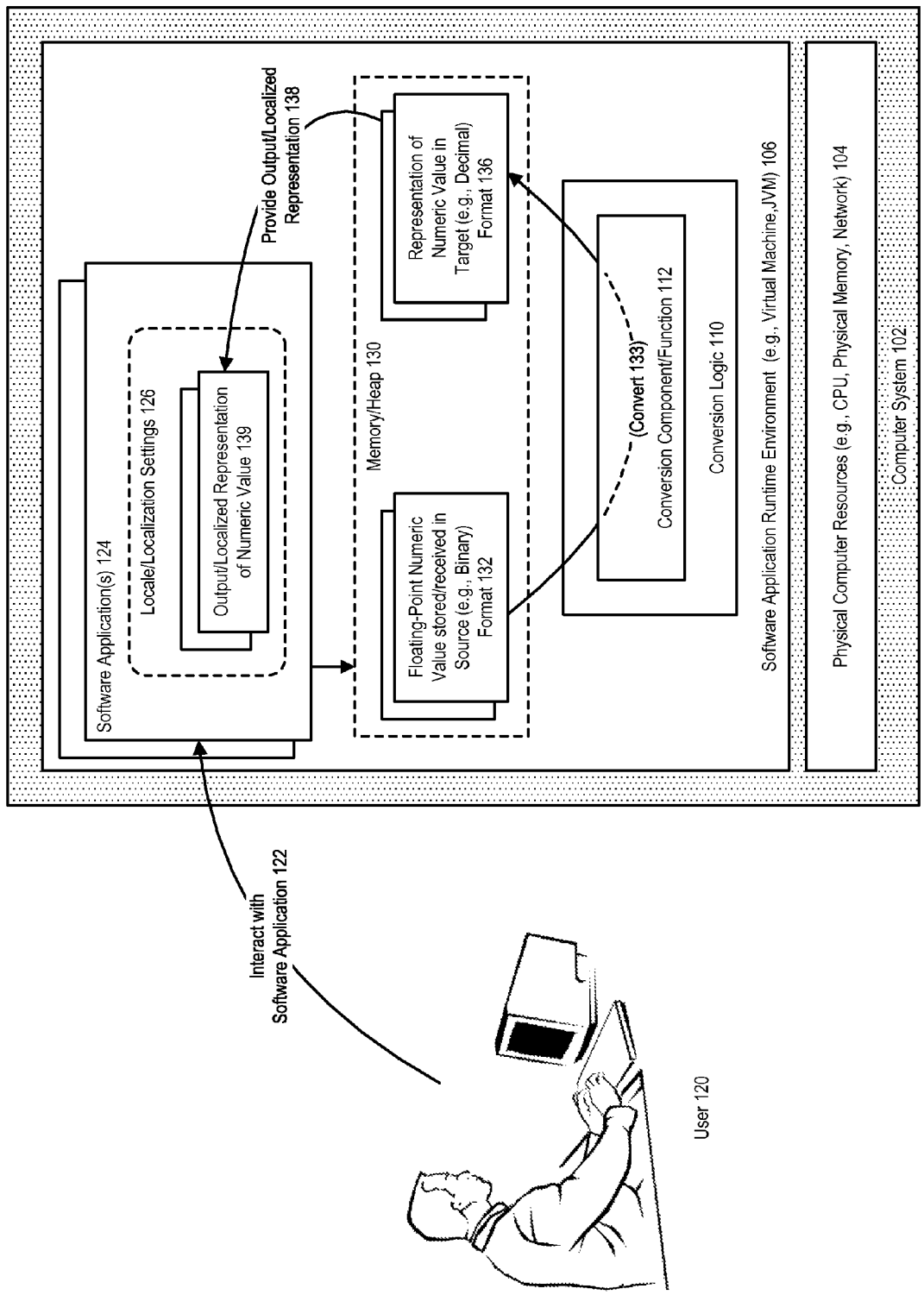
FIG. 1 illustrates a system for conversion of numeric values between number base formats, for use with software applications, in accordance with an embodiment.

As described above, within a typical computer system, a common task is the conversion of data between different number bases, for example between base-2 (binary) and base-10 (decimal) representations. However, although human users are familiar with decimal numbering, computers generally store numeric values (e.g., integer or floating-point values) in binary format. Such numeric values understood by the computer in their binary format must generally be converted to a corresponding decimal representation before they can be presented within a software application (for example, a business application) that is designed for access by a user. Additionally, preparing the final decimal representation for use with a particular target locale may necessitate a further conversion to the ultimate representation required by the target locale, requiring yet further computation.

In accordance with various embodiments, described herein are systems and methods for conversion of numeric values between different number base formats, for use with software applications.

In accordance with an embodiment, a conversion component or function enables floating-point numeric values to be passed in a source number base (e.g., binary) format. An integral part of the numeric value is isolated and converted to an integer. A fractional part of the numeric value is also isolated, scaled up by a power of a target number base (e.g., decimal), and the scaled value then converted to an integer, while limiting the isolation and conversion of the fractional part to a required precision or number of digits, depending on the particular requirements of a software application. In accordance with an embodiment, the isolation and conversion of the fractional part can be performed by scaling using a floating-point multiply operation. The fractional part can then be rounded if needed, including determining an exact roundoff as appropriate, and if necessary propagating the rounding to the integral part. Digits from the resulting integers representing the integral and fractional parts can then be collected and used to prepare a representation of the original numeric value in the target number base format.

In accordance with an embodiment, the required precision or number of digits can be determined by the particular requirements of the software application that will use the output (e.g., decimal) representation. For example, a software application which uses or displays financial or currency information may require its decimal representations of currency amounts to include two digits of scale (i.e., two digits following the decimal point). Other software applications may require their decimal representations to include three, four, or some other digits of scale. However, it is not a requirement of the techniques described herein that the original starting numeric value can be fully reconstructed from any resulting or output string value. Generally described herein, the technique is only limited in the number of digits which can be converted in any particular batch by the width of the integer format being used for the final, e.g., binary to decimal, conversion. Both 32-bit int and 64-bit long formats provide sufficient available digits for the use cases described herein.

In accordance with an embodiment, the numeric value can be prepared for output representation according to the requirements of a particular target locale. For example, different countries may recognize different schemes to represent large numbers, such as inserting grouping characters at different locations within the number.

In accordance with an embodiment, the systems and methods described herein can be used within a software development kit, such as a Java Development Kit, for use in developing, e.g., Java software applications that can then include the logic or otherwise perform the conversion of numeric values from a source (e.g., binary) format to a target (e.g., decimal) format representation, as described herein.

In accordance with various embodiments, the systems and methods described herein can also be used with other software languages or environments such as, for example, in C/C++ application environments, or within a database kernel for use in conversion of numeric values stored within a database from their binary to decimal representations.

System for Conversion Between Number Base Formats

FIG. 1 illustrates a system for conversion of numeric values between number base formats, for use with software applications, in accordance with an embodiment.

As shown in FIG. 1, in accordance with an embodiment, a computer system 102 can include physical computer resources 104, such as one or more processors/CPUs, physical memory, and network components. In accordance with various embodiments, other physical computer resources can be included as appropriate.

In accordance with an embodiment, a software application runtime environment 106, such as a virtual machine, Java virtual machine (JVM), or other runtime environment, can be provided for execution of software applications. The software application runtime environment can include a conversion logic 110, having a conversion component or function 112 (generally referred to herein as a conversion function), or similar functionality, which enables numeric values passed in a source number base (e.g., binary) format to be prepared for output representation in a target number base (e.g., decimal) format.

In accordance with an embodiment, a user 120 can interact 122 with one or more software applications 124 running within the runtime environment. Optionally, each software application can be associated with particular requirements for output representation within that software application, and can also have a locale or localization setting 126 associated therewith which indicate requirements for output representation within a particular target locale. For example, a software application which uses or displays financial or currency information may require its decimal representations of currency amounts to include two digits of scale, and to have its integral values grouped in comma-separated groups of three digits. Different software applications may require different digits of scale or forms of decimal representation.

In accordance with an embodiment, as the software application runs, the conversion function can be used with one or more numeric values stored or received in a source (e.g., binary) format, for example, within a heap 130, to convert those numeric values to the target number base (e.g., decimal) representation, for use with the software application.

In accordance with an embodiment, optionally the numeric value can also be prepared for output representation according to the particular locale associated with the software application.

Figure 2:
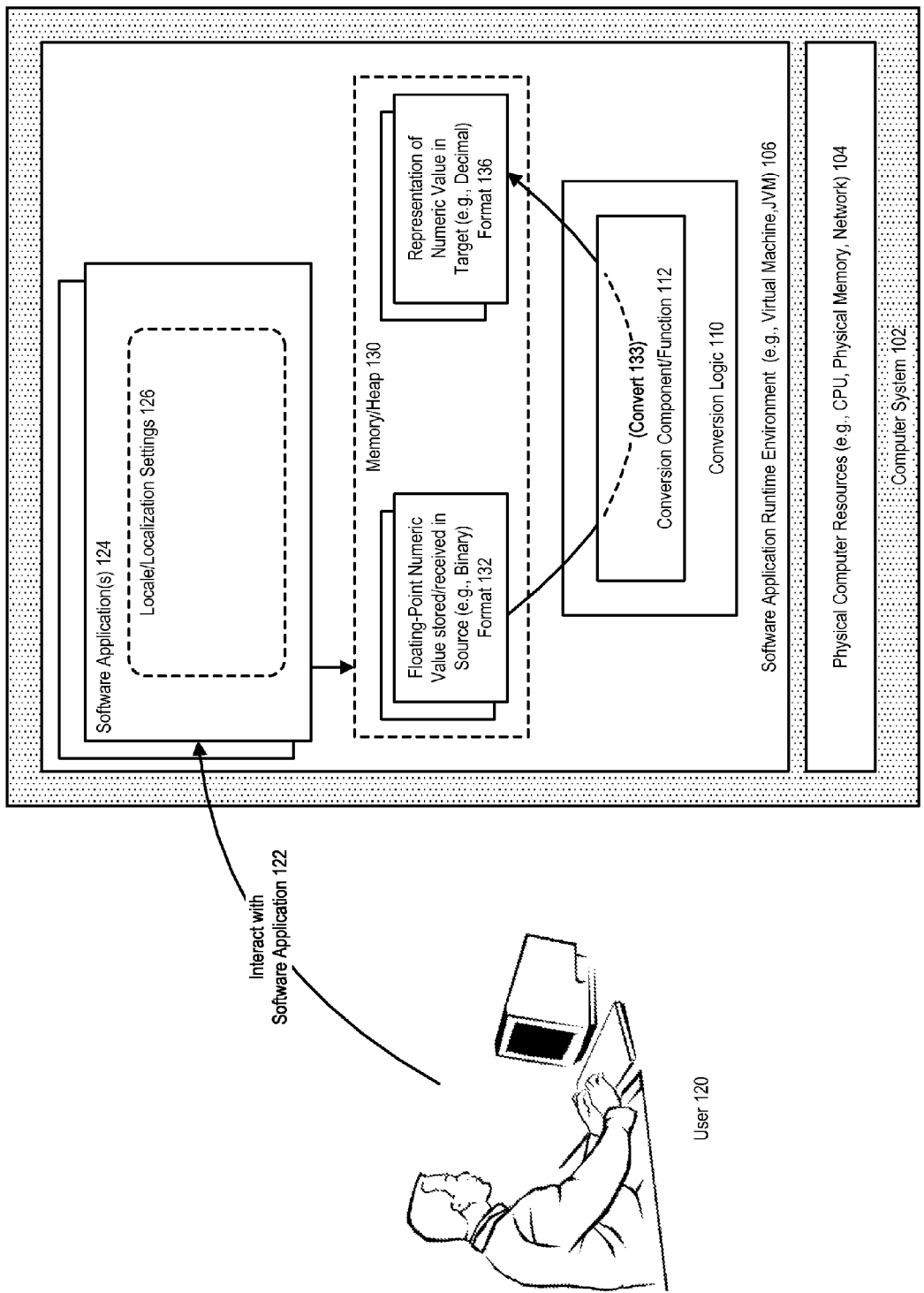
FIG. 2 further illustrates a system for conversion of numeric values, in accordance with an embodiment.
Figure 3:
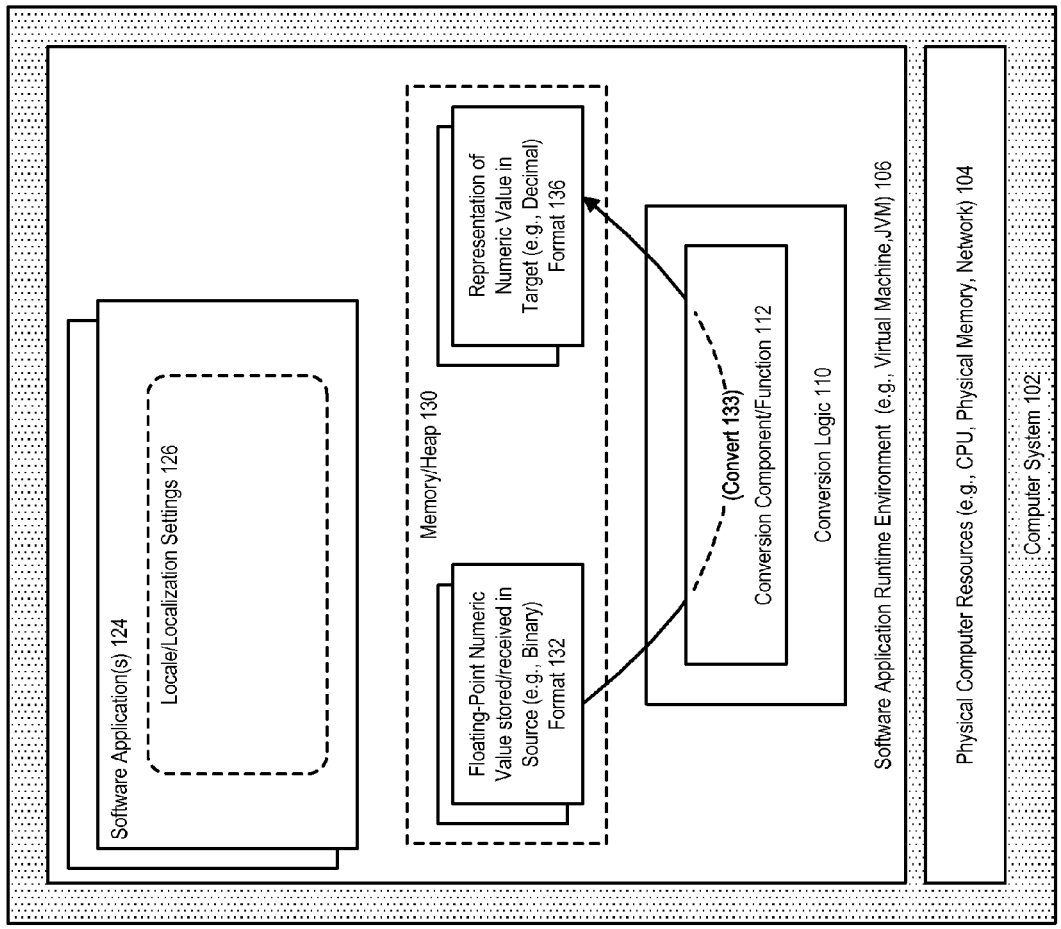
FIG. 3 further illustrates a system for conversion of numeric values, in accordance with an embodiment.
Figure 3:
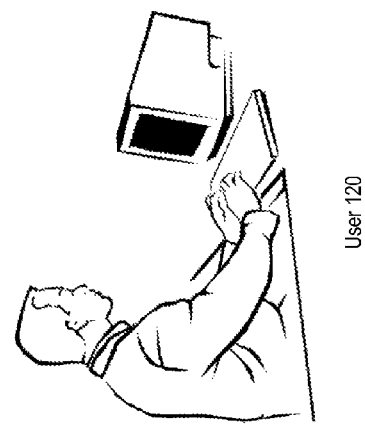
Figure 4:
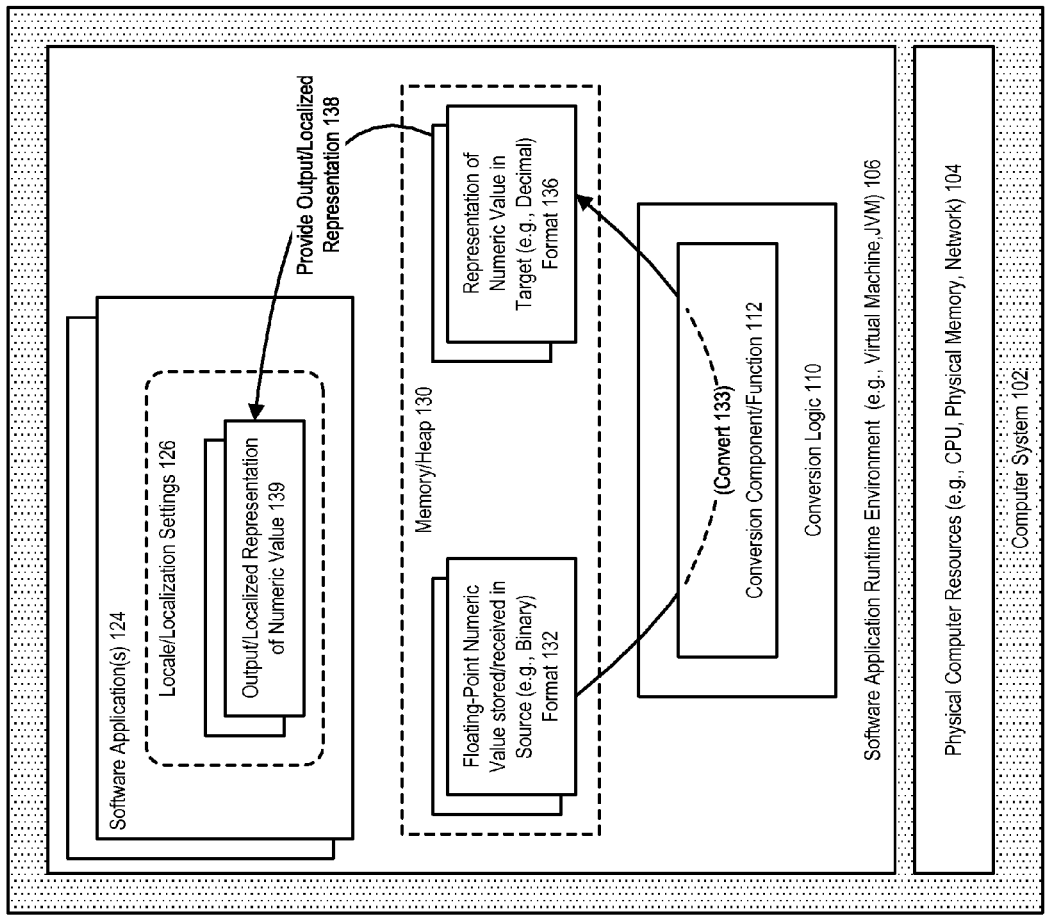
FIG. 4 further illustrates a system for conversion of numeric values, in accordance with an embodiment.
Figure 4:
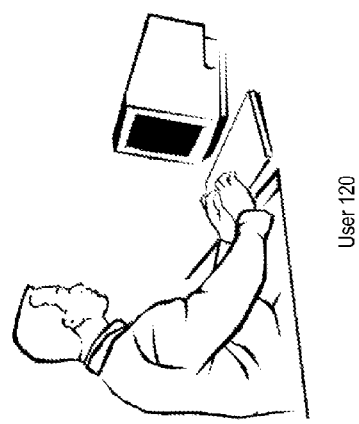

FIGS. 2-4 further illustrate a system for conversion of numeric values, in accordance with an embodiment.

As shown in FIG. 2, in accordance with an embodiment, for a particular software application or software method instance, the conversion function can be first validated for subsequent use with one or more numeric values stored or received, for example, within the heap, in a source (e.g., binary) format 132.

For example, as described below, a "fast-path" conversion function can be validated for use with passed double values only in certain circumstances, such as the passed double value having a magnitude within certain limits, the rounding policy or mode being used is to nearest-even, and the destination format requiring either two or three digits of scale.

As shown in FIG. 3, if the system determines that use of the conversion function is valid for a particular software application or software method instance, then it can be used with passed numeric values to convert 133 those numeric values to corresponding representations in a target (e.g., decimal) format 136, for use with the software applications.

In accordance with an embodiment, use of the conversion function provides performance advantages, as described below. However, if the system determines that the use of the conversion function is not valid for a particular instance (for example, the numeric value exceeds the range of supported values, or the application requires more digits of scale in its final decimal representation), then another method of creating the output representation can be used for that particular instance.

As shown in FIG. 4, when the integers that will make up the output representation have been determined, the numeric value can be prepared 138 for output representation, optionally according to a particular locale 139 associated with the software application.

The described approach can be used to improve performance when compared with previous methods of, e.g., binary-to-decimal conversion in which each decimal digit is collected one after the other, requiring computationally expensive operations on floating-point values and long integer types, both for collecting the digits and for reevaluating algorithm invariants for the next digit collection.

For example, in accordance with an embodiment, rather than collecting decimal digits in a one-by-one manner, the approach can be applied to a range of IEEE 754 values which are most applicable to business applications and which correspond to values whose absolute value or magnitude fits within the Java integer range. By taking advantage of the mathematical properties of these values, and restricting the localization process to a minimum, the approach can provide improvements in speed, particularly with just-in-time (JIT) servers or client compilers, for operations involving values that are within this range, including, for example, the display of decimal representations of those values.

Conversion Function

Figure 5:
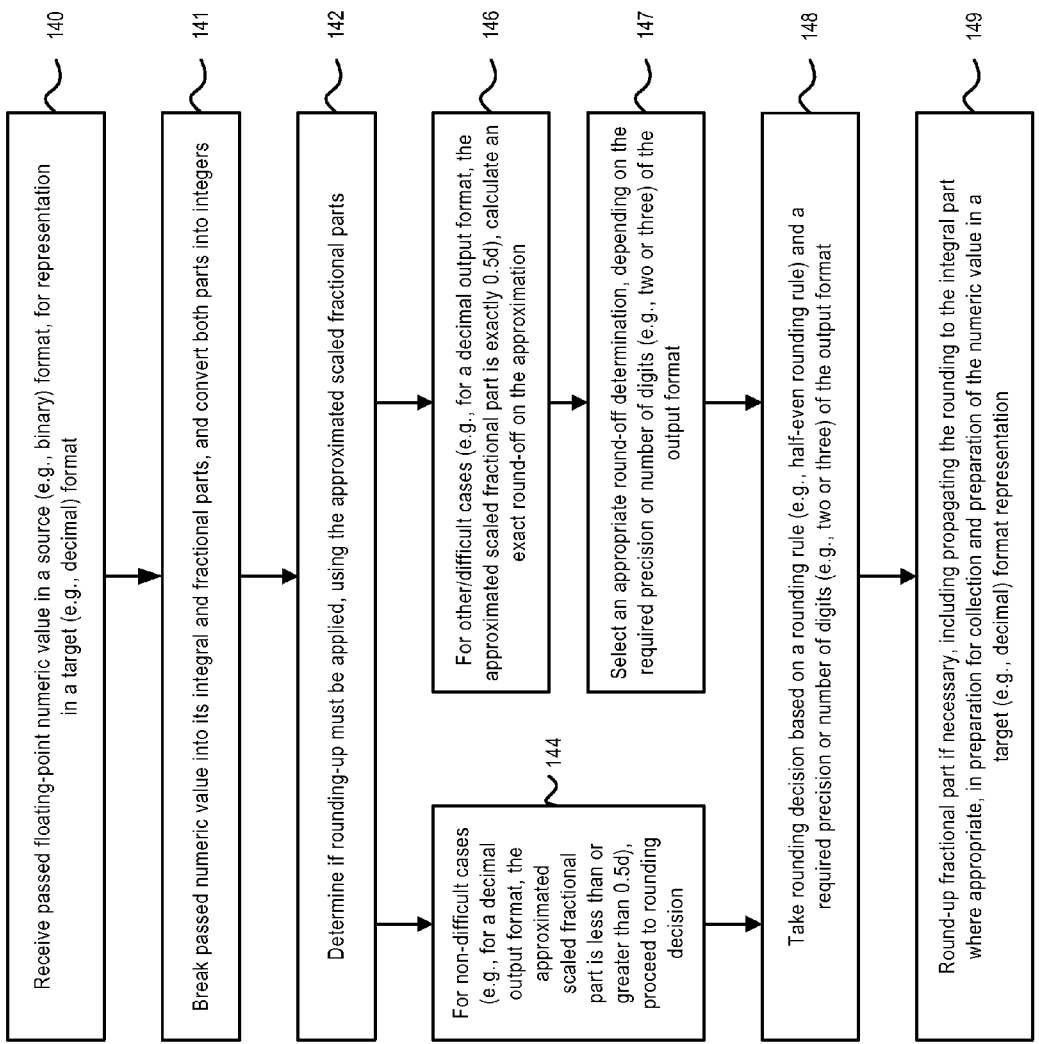
FIG. 5 is a flowchart that illustrates use of a conversion function for conversion of numeric values, in accordance with an embodiment.

FIG. 5 is a flowchart that illustrates use of a conversion function for conversion of numeric values between a source (e.g., binary) format and a target (e.g., decimal) format, in accordance with an embodiment.

In accordance with an embodiment, the conversion of a passed numeric value in a source (e.g., binary) format, for example as a floating-point double value, can be performed by breaking the passed numeric value into its integral and fractional parts, and converting the parts into integers.

In accordance with an embodiment, the conversion can be performed in two phases, including conversion of the integral part of the double value, followed by conversion of the fractional part of the double value, limited to two or three digits of scale, or decimal precision, as appropriate. In accordance with an embodiment, the isolation and conversion of the fractional part can be performed by scaling using a floating-point multiply operation. In accordance with an embodiment, the conversion of the integral part and the fractional part can be performed in parallel. With a fine-grained parallelism, the integral part can be computed with and without assuming a carry-out from the fractional part.

The isolation and conversion of the integral part of the double value is a relatively straightforward task. The isolation and conversion of the fractional part is more subtle, and relies on rounding properties of the double value to the precision required.

In accordance with an embodiment, the system can determine that the conversion function can be validly applied when a passed double value has a magnitude less than a maximum defined integer value (e.g., Integer.MAX_VALUE in Java terminology, or as defined in the Java core libraries), the rounding mode being used is to nearest-even, and the destination format requires either two or three digits of scale (i.e., two or three digits respectively following the decimal point), which reflects the common use cases for many business applications. For example, currency values in software business applications are commonly represented in their decimal form with two digits of scale such as, e.g., $123.50.

In accordance with an embodiment, the conversion function is used only for application data that meets certain predefined conditions, as further described below, including, for example, that the absolute value of the double value is less than or equal to the maximum defined integer value.

In accordance with an embodiment, if it is determined that the conversion function can be applied, then a rounding decision is made, first using an approximated scaled fractional part, as to whether rounding-up must be applied, for example, by following the half-even rounding rule.

For difficult cases, such as (for a binary-to-decimal use case) when the approximated scaled fractional part is exactly 0.5 d, the rounding decision can be refined by calculating an exact roundoff on the approximation, and then making the correct rounding decision.

In accordance with an embodiment, under a round to nearest-even policy, the returned result is a digit string of a number in the (in this case, decimal) destination format that is closest to the exact numeric value of the (in this case, binary) input value. If two destination format numbers are equally distant, then the one with the last digit even is returned.

To compute a correctly rounded value, some information about those digits that lie beyond the smallest returned digit position needs to be consulted. For example, in accordance with an embodiment, a guard digit, round digit, and sticky bit can be used beyond the returned digit position. If the discarded part of the input is sufficiently large in magnitude, then the returned digit string is incremented. In a round to nearest-even mode, this threshold to increment occurs near the half-way point between digits. The sticky bit can be used to record if there is any remaining numerical value of the input value after rounding to the destination format, and is consulted only in close-to-halfway rounding cases.

Given the computation of the digit and bit values, in accordance with an embodiment, rounding can then be reduced to that of a table lookup. For decimal numbers, examples of several even/odd cases may look like those shown in Table 1:

TABLE 1

| Last | Round | Sticky | Result | Remark |
|------|-------|--------|--------|--------|
| 6 | 5 | 0 | 6 | Exactly halfway, return even digit |
| 6 | 5 | 1 | 7 | A little bit more than halfway, round up |
| 7 | 5 | 0 | 8 | Exactly halfway, round up to even |
| 7 | 5 | 1 | 8 | A little bit more than halfway, round up |

Analogous entries would exist for other even/odd last-returned digits.

The rounding decision points for a decimal target number base format are equal to 5 scaled by a power of 10. For example, $0.5=5^{-1}$ (the rounding point to an integer value, with no fractional digits); $0.05=5^{-2}$ (the rounding point to one fractional digit); $0.005=5^{-3}$ (the rounding point to two fractional digits); and $0.0005=5^{-4}$ (the rounding point to three fractional digits). However, decimal negative powers of 5 which are smaller than 0.5 are not exactly representable as binary fractions. In particular, neither 0.005 (the round limit for a two-digit scale) nor 0.0005 (the round limit for a three-digit scale) are exactly representable as binary fractions. Therefore, for input values near these cases the sticky bit is known to be set, which reduces the lookup table for the above examples to that shown in Table 2:

TABLE 2

| Last | Round | Sticky | Result | Remark |
|------|-------|--------|--------|--------|
| 6 | 5 | 1 | 7 | A little bit more than halfway, round up |
| 7 | 5 | 1 | 8 | A little bit more than halfway, round up |

In other words, if the round digit is 5, then the sticky bit is known to be set. However, if the round digit is something other than 5, then the sticky bit is not relevant.

This characteristic allows some of the determination, as to whether or not to increment a particular destination decimal value or decimal representation, to be based on tests of binary computations of the binary input number. The particular method by which the rounding check is performed will vary with the source and destination bases, as well as by the rounding mode used. Many of the examples and listings described herein illustrate conversion from binary to decimal bases, and use of a round to nearest-even mode. However, similar techniques can be used with other rounding policies, and for conversion between other number bases.

In accordance with an embodiment, the fractional part is then rounded-up as appropriate, including where appropriate propagating the rounding to the integral part in the event of an "all-nine" (e.g., 0.99, or 0.999) situation of the scaled fractional part. For example, in an environment that requires two digits of scale in its output representation, the system may be called upon to round 19.997 to two decimal places following the decimal point. Using the techniques described herein, the initial conversion of the passed numeric value will initially provide an integral part of "19". The unrounded fractional digits present an "all-nine" situation, i.e. "99". However, since in this example the next digit beyond the required digits of scale is greater than 5, the "99" digits will be rounded up to "00", and a carry-out will increment the integral part to "20". Therefore, the final output representation, to two digits of scale or decimal places, will be "20.00". Similarly, in an environment that requires three digits of scale in its output representation then, in some instances, it may be appropriate to, e.g., propagate a rounding from 1.999 to a representation of "2.000".

In accordance with an embodiment, the digits from the resulting integers representing the integral and fractional parts can then be collected, for example, within a digit buffer or character array container, for use in preparing an output, e.g., decimal, representation of the original numeric value.

In accordance with an embodiment, the conversion function process can proceed generally as shown in FIG. 5, including, at step 141, receiving a passed floating-point numeric value in a source (e.g., binary) format, for representation in a target (e.g., decimal) format; and, at step 142, breaking it into its integral and fractional binary parts, and converting both the integral and fractional parts into integers.

At step 142, a determination is made as to whether rounding-up must be applied using the approximated scaled fractional parts.

At step 144, for non-difficult cases (e.g., the approximated scaled fractional part is less than or greater than 0.5 d), the system can proceed to take a rounding decision.

Conversely at step 146, for other/difficult cases (e.g., the approximated scaled fractional part is exactly 0.5 d), the system can calculate an exact roundoff on the approximation. Then, at step 147, an appropriate roundoff determination can be selected, e.g., using a fast two sum calculation or by other means, depending on the required precision or number of digits (e.g., two or three digits) of the output format.

At step 148, a rounding decision is taken based on the rounding rule currently being used (e.g., a half-even rounding rule), and the required precision or number of digits (e.g., two or three) of the output format.

At step 149, the fractional part can be rounded-up if necessary, including propagating the rounding to the integral part where appropriate, in preparation for collection and preparation of the numeric value in a target (e.g., decimal) format representation.

In accordance with an embodiment, optionally and if appropriate, any required prefixes or suffixes can be added to meet the particular requirements of a software application, and the output localized for use with a particular target locale.

Each of the above tasks is further described below. Additionally, while many of the examples described herein illustrate the techniques as used to support conversion between binary as source and decimal as target number base formats, in accordance with various embodiments, the techniques can be similarly used to convert numeric values between different or other number base formats, for example from binary to base-5 formats, or from decimal to hexadecimal formats.

Determination of Validity of Performing Binary-to-Decimal Conversion

As described above, in accordance with an embodiment, for a particular software application or software method instance, the conversion function can be first validated for subsequent use with one or more input or passed numeric values. For example, in accordance with an embodiment which supports binary-to-decimal conversion, when the system is called upon to determine a decimal representation for use, e.g., with a format double method for a software application, a check can be made as to the validity of using the conversion function for a particular instance of the software application or method, and the input numeric value.

For example, when a binary-to-decimal conversion is being performed in the context of an OpenJDK Java environment which utilizes a DecimalFormat class and a fast-path conversion function, if the fast-path function is validated for the particular instance, then the system can set a fast-path state as "true", and proceed to initialize the fast-path function. In accordance with an embodiment, such a check can be performed using a fast-path check method, e.g., checkAndSetFastPathStatus( ), an example of which is illustrated in Listing 1. The logic illustrated in Listing 1, and in the other listings provided herein, generally illustrate a binary-to-decimal use case, but can be adapted for use in converting between other number base formats, in accordance with various embodiments.

Generally, such a check for validity should be used sparingly, since frequent checking may reduce overall performance. In practice, this would mean avoiding frequent changes of the properties of a particular instance, since for most properties, each time a property change occurs for a given instance, a call to verify its, e.g., fast-path validity, would be needed at the next format call.

Listing 1

```
private void checkAndSetFastPathStatus( ) {
boolean fastPathWasOn = isFastPath;
if ((roundingMode == RoundingMode.HALF_EVEN) &&
    (isGroupingUsed( )) &&
    (groupingSize == 3) &&
    (multiplier == 1) &&
    (!decimalSeparatorAlwaysShown) &&
    (!useExponentialNotation)) {
isFastPath = ((minimumIntegerDigits == 1) &&
              (maximumIntegerDigits >= 10));
if (isFastPath) {
  if (isCurrencyFormat) {
      if ((minimumFractionDigits != 2) ||
          (maximumFractionDigits != 2))
         isFastPath = false;
  } else if ((minimumFractionDigits != 0) ||
             (maximumFractionDigits != 3))
         isFastPath = false;}
} else isFastPath = false;
}
```

As illustrated in Listing 1, in accordance with an embodiment, the conditions/rules used to determine the validity of using the fast-path function for a particular instance of a software application or method can be similar to those of a default DecimalFormat instantiation, including, for example, that the rounding mode used is half-even rounding; and the number of fractional digits used for currency representation is 2, while the minimum number of fractional digits used for decimal representations is 0, and the maximum number is 3. As described above, such requirements reflect the common use cases for many business applications.

The example provided above illustrates the use of checkAndSetFastPathStatus to determine the validity of performing a binary-to-decimal conversion in the context of an OpenJDK Java environment that utilizes DecimalFormat class. However, the DecimalFormat class provides additional formatting features that are generally not necessary for binary-to-decimal conversion, such as grouping size, multiplier, decimal separator, exponential notation, and number of integer digits. In accordance with other embodiments, including those that may not use DecimalFormat class, other means of determining the validity of performing a binary-to-decimal conversion can be used.

Fast Binary-to-Decimal Conversion Algorithm

In accordance with an embodiment, when a check has been confirmed as to the validity of using the conversion function (e.g., a fast-path function) for a particular instance of an input or passed numeric value, the system can proceed to use the fast-path function to convert the input numeric value from its binary to decimal representation.

In accordance with an embodiment, the system can use a fast-path formatting method, e.g., fastDoubleFormat( ), an example of which is illustrated in Listing 2, to build a formatted result, and store the result in a dedicated fast-path data container.

In the example illustrated in Listing 2, the parameter "d" is the input double numeric value to be formatted; while the parameter "negative" is a flag that indicates if the value of d is negative.

In accordance with an embodiment, the fast-path formatting method receives and breaks a passed floating-point numeric value into its integral and fractional binary parts, and converts both the integral and fractional parts into integers. A rounding decision is then made, first using an approximated scaled fractional part, as to whether rounding-up must be applied, for example, by following the half-even rounding rule.

In accordance with an embodiment, for difficult cases, such as (for a binary-to-decimal use case) when the approximated scaled fractional part is exactly 0.5 d, the rounding decision can be refined by calculating an exact roundoff on the approximation, and then making a fine-grained or correct rounding decision.

For example, in accordance with an embodiment, a roundup utility method, e.g., exactRoundUp( ), can be called for difficult cases to both calculate the exact roundoff on the approximation and take a correct rounding decision.

In accordance with an embodiment, the fractional part can also be rounded-up as appropriate including, if necessary, propagating the rounding to the integral part in the event of an "all-nine" situation.

Listing 2

```
Private void fastDoubleFormat(double d, boolean negative) {
char[ ] container = fastPathData.fastPathContainer;
// Exact integral part of d.
int integralPartAsInt = (int) d;
// Exact fractional part of d.
double exactFractionalPart = d − (double) integralPartAsInt;
// Approximated scaled fractional part of d.
Double scaledFractional =
exactFractionalPart * fastPathData.fractionalScaleFactor;
// Exact integral part of scaled fractional above.
Int fractionalPartAsInt = (int) scaledFractional;
```

Listing 2

```
// Exact fractional part of scaled fractional above.
scaledFractional = scaledFractional − (double)
fractionalPartAsInt;
boolean roundItUp = false;
if (scaledFractional >= 0.5d) {
    if (scaledFractional == 0.5d)
        // Rounding need fine-grained decision.
        roundItUp = exactRoundUp(exactFractionalPart,
            fractionalPartAsI
    else
        roundItUp = true;
if (roundItUp) {
// Rounds up both fractional part and also integral if needed.
    if (fractionalPartAsInt < fastPathData.fractionalMaxIntBound) {
        fractionalPartAsInt++;
    } else {
        // Propagate rounding to integral part for "all nines" case.
        fractionalPartAsInt = 0;
        integralPartAsInt++; }}}
// Collecting digits.
collectFractionalDigits (fractionalPartAsInt, container,
fastPathData.fractionalFirstIndex);
collectIntegralDigits (integralPartAsInt, container,
fastPathData.integralLastIndex);
// Localizing digits.
if (fastPathData.zeroDelta != 0) localizeDigits(container);
// Adding prefix and suffix.
if (negative) {
    if (fastPathData.negativeAffixesRequired)
        addAffixes(container, fastPathData.charsNegativePrefix,
        fastPathData.charsNegativeSuffix);
    } else if (fastPathData.positiveAffixesRequired)
        addAffixes(container, fastPathData.charsPositivePrefix,
        fastPathData.charsPositiveSuffix);
}
```

In accordance with an embodiment, the digits can then be collected from the resulting integral and fractional parts, including optionally setting any required grouping characters, prefixes, or suffixes.

In accordance with an embodiment, the approach can be used to restrict floating-point operations to a few simple operations (e.g., two additions, one multiplication, and one conversion to integer), with the remaining operations being relatively simple operations on, for example, two's complement integer types (32-bits). During compilation of a software application, such operations generally convert to fast assembly language operations. In accordance with an embodiment, the extraction of the integral and fractional part of the numeric value can also be made quickly, since they can be limited to three operations of simple floating-point arithmetic, including two raw conversions to integer, and one floating-point subtraction. The decimal digits can then be collected from the integral parts using integer arithmetic.

Determination of Exact Roundoff where Appropriate

As described above, in accordance with an embodiment, for difficult cases, such as (for a binary-to-decimal use case) when the approximated scaled fractional part is exactly 0.5 d, the rounding decision can be refined by calculating an exact roundoff on the approximation, and then making a fine-grained or correct rounding decision, using an exact roundup method.

Listing 3 illustrates an example exact roundup method, e.g., exactRoundUp( ), in accordance with an embodiment, in which the parameter "fractionalPart" is the fractional value on which a rounding decision is taken; the parameter "scaledFractionalPartAsInt" as shown in Listing 3 and Listing 4 is the integral part of the scaled fractional value; and "return" provides the decision taken with regard to half-even rounding. As described above, the provided listings generally illustrate a binary-to-decimal use case, but can be adapted for use in converting between other number base formats, in accordance with various embodiments.

In accordance with an embodiment, the exact roundup method takes a correct half-even rounding decision on a passed fractional value, at the scaled decimal point (two digits for currency cases, and three digits for decimal non-currency cases), when the fractional part after scaled decimal point is exactly 0.5 d, by means of exact calculations on the fractional part of the floating-point value.

In accordance with an embodiment, an exact roundoff can be obtained through exact calculation techniques as described, for example, in "Adaptive Precision Floating-Point Arithmetic and Fast Robust Geometric Predicates", Jonathan Richard Shewchuk, Oct. 1, 1997, CMU-CS-96-140R, which is incorporated herein by reference. In accordance with other embodiments, other methods of determining an exact roundoff can be used.

In accordance with an embodiment, the exact roundup method is called by a fast-path formatting method, e.g., fastDoubleFormat( ), with the precondition expected to be verified by the passed parameters that the integral part of the scaled fractional value is equal to the integer product of the fractional value on which a rounding decision is taken (fractionalPart) times a scaling factor.

In accordance with an embodiment, the roundoff error that is made by fastDoubleFormat( ) is then calculated on the remaining scaled fractional part, using a two product scale factor of 1000.0 d or 100.0 d.

In accordance with an embodiment, an optimized exact two product calculation of the passed fractional part with scale factor is performed, using a cascaded summation, including ordering the summation from smallest to greatest, so that a fast two sum can be applied without any additional error; which is useful in those rare cases where an exact roundoff is required.

In accordance with an embodiment, the scale factor to be used is either 100 (for currency cases) or 1000 (for decimal non-currency cases). When the scale factor is 1000, the exact roundup method replaces this by (1024−16−8)=1000. When the scale factor is 100, the exact roundup method replaces this by (128−32+4)=100, where every multiplication by a power of 2 (i.e., 1024, 128, 32, 16, 8, 4) is an exact calculation.

Listing 3

```
private boolean exactRoundUp(double fractionalPart, int
scaledFractionalPartAsInt) {
    double approxMax;            // Will always be positive.
    double approxMedium;         // Will always be negative.
    double approxMin;
    double fastTwoSumApproximation = 0.0d;
    double fastTwoSumRoundOff = 0.0d;
    double bVirtual = 0.0d;
    if (isCurrencyFormat) {
        // Scale is 100 = 128 − 32 + 4.
        // Multiply by 2**n is a shift. No roundoff. No error.
        approxMax          = fractionalPart * 128.00d;
        approxMedium       = − (fractionalPart * 32.00d);
        approxMin          = fractionalPart * 4.00d;
    } else {
        // Scale is 1000 = 1024 − 16 − 8.
        // Multiply by 2**n is a shift. No roundoff. No error.
        approxMax          = fractionalPart * 1024.00d;
        approxMedium       = − (fractionalPart * 16.00d);
        approxMin          = − (fractionalPart * 8.00d);}
```

Listing 3

```
// FastTwoSum(approxMedium, approxMin).
assert(-approxMedium >= Math.abs(approxMin));
fastTwoSumApproximation = approxMedium + approxMin;
bVirtual = fastTwoSumApproximation - approxMedium;
fastTwoSumRoundOff = approxMin - bVirtual;
double approxS1 = fastTwoSumApproximation;
double roundoffS1 = fastTwoSumRoundOff;
// FastTwoSum(approxMax, approxS1);
assert(approxMax >= Math.abs(approxS1));
fastTwoSumApproximation = approxMax + approxS1;
bVirtual = fastTwoSumApproximation - approxMax;
fastTwoSumRoundOff = approxS1 - bVirtual;
double roundoff1000 = fastTwoSumRoundOff;
double approx1000 = fastTwoSumApproximation;
double roundoffTotal = roundoffS1 + roundoff1000;
// FastTwoSum(approx1000, roundoffTotal);
assert(approx1000 >= Math.abs(roundoffTotal));
fastTwoSumApproximation = approx1000 + roundoffTotal;
bVirtual = fastTwoSumApproximation - approx1000;
// Now we have got the roundoff for the scaled fractional
double scaledFractionalRoundoff = roundoffTotal - bVirtual;
```

As described above, in accordance with an embodiment, the exactRoundUp method may only need to be called rarely, in those instances in which an exact roundoff is required.

Taking of Rounding Decision

In accordance with an embodiment, as described above, a rounding decision can be made, first using an approximated scaled fractional part, as to whether rounding-up must be applied, for example, by following the half-even rounding rule.

The above-described two product calculation can provide an exact roundoff on the approximated scaled fractional. The approximation is exactly 0.5 d, since that has already been tested by the caller, such as the fast-path formatting method, e.g., fastDoubleFormat( ).

Listing 4 illustrates an example of a method for taking a rounding decision, in accordance with an embodiment.

Listing 4

```
if (scaledFractionalRoundoff > 0.0) { return true;
    } else if (scaledFractionalRoundoff < 0.0) { return false;
        } else if ((scaledFractionalPartAsInt & 1) != 0) { return true;}
        return false;}
```

In accordance with an embodiment, the rounding decision can be based first on the sign of the calculated exact roundoff. Since this is an exact roundoff, it cannot be positive with a scaled fractional less than 0.5 d, as well as negative with a scaled fractional greater than 0.5 d, which leaves the following 3 cases:

If the sign of the calculated exact roundoff is positive, and thus the scaled fractional is strictly greater than 0.500, then the decision is made to round-up;

If the sign of the calculated exact roundoff is negative, and thus the scaled fractional is strictly greater than −0.500, then the decision is made to not round-up;

If the sign of the calculated exact roundoff is zero, and thus the scaled fractional is exactly 0.5, and given that half-even rounding applies, then the decision is made to round-up only if the integral part of the scaled fractional is odd.

Collection of Integral Digits

In accordance with an embodiment, the system can then collect integral digits from the passed numeric value, while setting grouping characters as needed, and update a first-used index accordingly.

Listing 5 illustrates an example of an integral digits collection method, e.g., collectIntegralDigits( ), in accordance with an embodiment, which loops downward starting from a backward index position, in which the parameter "number" is the integer value from which digits are collected; the parameter "digitsBuffer" is a character array container where digits and grouping characters are stored; and the parameter "backwardIndex" is the position from which the system starts storing digits in the digit buffer.

Listing 5

```
private void collectIntegralDigits(int number, char[ ] digitsBuffer,
int backwardIndex) {
int index = backwardIndex;
int q;
int r;
while (number > 999) {
// Generates 3 digits per iteration.
q = number / 1000;
r = number - (q << 10) + (q << 4) + (q << 3); // -1024 +16 +8 = 1000.
number = q;
digitsBuffer[index--] = DigitArrays.DigitOnes1000[r];
digitsBuffer[index--] = DigitArrays.DigitTens1000[r];
digitsBuffer[index--] = DigitArrays.DigitHundreds1000[r];
digitsBuffer[index--] = fastPathData.groupingChar;}
// Collects last 3 or less digits.
digitsBuffer[index] = DigitArrays.DigitOnes1000[number];
if (number > 9) {
    digitsBuffer[--index] = DigitArrays.DigitTens1000[number];
        if (number > 99)
            digitsBuffer[--index] =
            DigitArrays.DigitHundreds1000[number];}
fastPathData.firstUsedIndex = index;}
```

For example, the above approach can collect three decimal digits within one loop, within a similar timeframe as previous methods might collect two decimal digits within one loop, resulting in a loop shortening of approximately 40%.

Collection of Fractional Digits

In accordance with an embodiment, the system can then collect appropriate digits, for example the 2 (currency) or 3 (decimal) fractional digits as appropriate, from the passed numerical value, starting at a starting position.

Listing 6 illustrates an example of a fractional digits collection method, e.g., collectFractionalDigits( ) method, in accordance with an embodiment, in which the parameter "number" is the integer value from which digits are collected; the parameter "digitsBuffer" is a character array container where digits and grouping characters are stored; and the parameter "startIndex" is the position from which the system starts storing digits in the digit buffer.

Listing 6

```
private void collectFractionalDigits(int number, char[ ]
digitsBuffer, int startIndex) {
int index = startIndex;
char digitOnes = DigitArrays.DigitOnes1000[number];
char digitTens = DigitArrays.DigitTens1000[number];
if (isCurrencyFormat) {
    // Currency case. Always collects fractional digits.
    digitsBuffer[index++] = digitTens;
    digitsBuffer[index++] = digitOnes;
```

Listing 6

```
    } else if (number != 0) {
        // Decimal case. Hundreds will always be collected
        digitsBuffer[index++] =
        DigitArrays.DigitHundreds1000[number];
        // Ending zeros won't be collected.
        if (digitOnes != '0') {
            digitsBuffer[index++] = digitTens;
            digitsBuffer[index++] = digitOnes;
        } else if (digitTens != '0')
            digitsBuffer[index++] = digitTens;
    } else
    // This is decimal pattern and fractional part is zero.
    // We must remove decimal point from result.
    index--;
    fastPathData.lastFreeIndex = index;}
```

Optional Inclusion of Prefixes and Suffixes

In accordance with an embodiment, optionally additional characters, prefixes, and suffixes can be added as appropriate.

For example, Listing 7 illustrates example of various utility methods (e.g., addAffixes( ), prependPrefix( ), and appendSuffix ( )), in accordance with an embodiment, which add passed prefixes and suffixes to the result container as appropriate; wherein the parameter "container" is the character array container which to prepend/append the prefix/suffix; the parameter "prefix" is the character sequence to prepend as a prefix; the parameter "suffix" is the character sequence to append as a suffix; and the parameter "len" is the number of characters to prepend/append.

Listing 7

```
private void addAffixes(char[ ] container, char[ ] prefix, char[ ]
suffix) {
// We add affixes only if needed (affix length > 0).
int pl = prefix.length;
int sl = suffix.length;
if (pl != 0) prependPrefix(prefix, pl, container);
if (sl != 0) appendSuffix(suffix, sl, container);}
private void prependPrefix(char[ ] prefix,
int len,
char[ ] container) {
fastPathData.firstUsedIndex -= len;
int startIndex = fastPathData.firstUsedIndex;
if (len == 1)
    container[startIndex] = prefix[0];
    else if (len <= 4) {
        int dstLower = startIndex;
        int dstUpper = dstLower + len - 1;
        int srcUpper = len - 1;
        container[dstLower] = prefix[0];
        container[dstUpper] = prefix[srcUpper];
        if (len > 2)
            container[++dstLower] = prefix[1];
        if (len == 4)
            container[--dstUpper] = prefix[2];
        } else
            System.arraycopy(prefix, 0, container, startIndex,
                len);}
private void appendSuffix(char[ ] suffix,
int len,
char[ ] container) {
int startIndex = fastPathData.lastFreeIndex;
if (len == 1)
    container[startIndex] = suffix[0];
    else if (len <= 4) {
        int dstLower = startIndex;
        int dstUpper = dstLower + len - 1;
        int srcUpper = len - 1;
        container[dstLower] = suffix[0];
        container[dstUpper] = suffix[srcUpper];
```

Listing 7

```
        if (len > 2)
            container[++dstLower] = suffix[1];
        if (len == 4)
            container[--dstUpper] = suffix[2];
        } else
            System.arraycopy(suffix, 0, container, startIndex, len);
fastPathData.lastFreeIndex += len;}
```

As illustrated in the example of Listing 7, in accordance with an embodiment, if the prefix/suffix to prepend/append is only 1 character long, then the system can simply assign this character. If the prefix/suffix is less than or equal to 4 characters, then a dedicated algorithm can be used. If the prefix/suffix is more than 4 characters, then a call to System.arraycopy can be used.

Optional Localization of Decimal Representation

As described above, in accordance with an embodiment, the output (e.g., decimal) representation ultimately provided by the computer system may depend on the target locale associated with a particular software application.

In accordance with an embodiment, optionally the system can convert digit characters from the digit buffer for use within a specified or current locale. Generally, such localization must be called before adding prefixes or affixes.

Listing 8 illustrates an example of a localize digits method, e.g., localizeDigits ( ), in accordance with an embodiment, wherein the parameter "digitsBuffer" is the character array container where the digits are stored, and wherein the method localizes the digits, using the groupingSize, and taking into account the fractional part.

Listing 8

```
private void localizeDigits(char[ ] digitsBuffer) {
// First take into account fractional part.
int digitsCounter = fastPathData.lastFreeIndex -
fastPathData.fractionalFirstIndex;
// The case when there is no fractional digits.
if (digitsCounter < 0) digitsCounter = groupingSize;
// Only the digits remains to localize.
for (int cursor = fastPathData.lastFreeIndex - 1;
    cursor >= fastPathData.firstUsedIndex;
    cursor--) {
    if (digitsCounter != 0) {
        // This is a digit char, we must localize it
        digitsBuffer[cursor] += fastPathData.zeroDelta;
        digitsCounter--;
    } else {
        // Decimal separator or grouping char. Reinit counter only.
        digitsCounter = groupingSize;}}}
```

In accordance with an embodiment, the numeric value can then be prepared for decimal representation according to the requirements of a particular target locale. In accordance with an embodiment, for the range of values considered, the localization process results in a simple char operation on the character values representing either a decimal digit or a punctuation character (i.e., a decimal separator or group separator).

The above-provided code listings of various methods are provided as examples, in accordance with various embodiments, for purposes of illustration of the techniques therein. In accordance with other embodiments, other types of methods and code listings can be used, to suit or address the needs of particular use cases or environments.

Exemplary Conversion and Localization of Numeric Values

Figure 6:
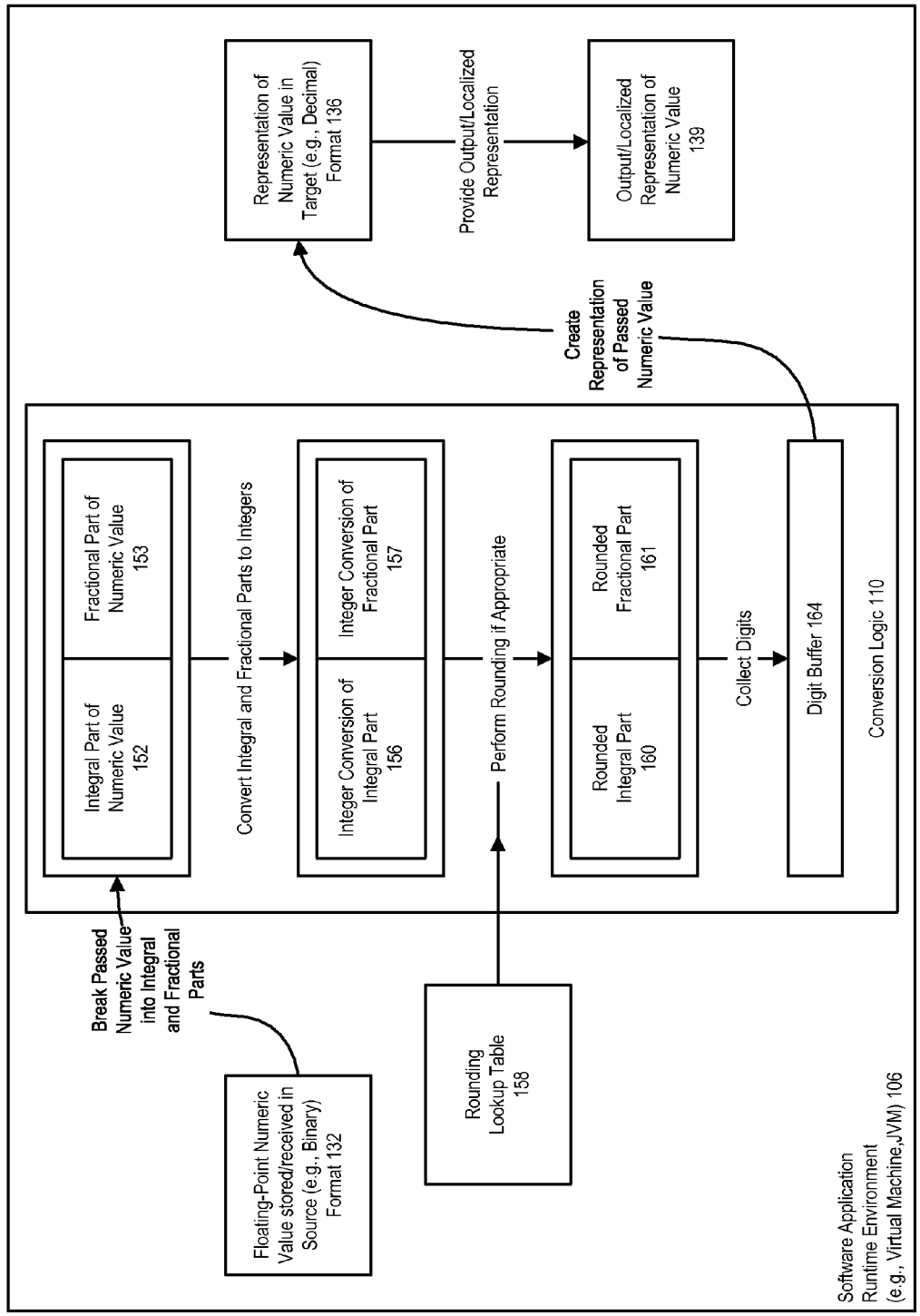
FIG. 6 illustrates the conversion of numeric values stored or received in a source (e.g., binary) format, to corresponding target (e.g., decimal) format representations, in accordance with an embodiment that supports localization of the output representation.

FIG. 6 illustrates the conversion of numeric values stored or received in a source (e.g., binary) format, to corresponding target (e.g., decimal) format representations, in accordance with an embodiment that supports localization of the output representation.

As shown in FIG. 6, in accordance with an embodiment, the conversion of a passed numeric value—for example, a floating-point double value in binary format, can be performed by first breaking the passed floating-point value into its integral part 152 and fractional part 153, and then converting the integral and fractional parts into integers (i.e., a first integer 156, and a second integer 157 respectively).

In accordance with an embodiment, a conversion, e.g., fast-path, function is applied when a double value has a magnitude less than a maximum defined integer value (e.g., Integer.MAX_VALUE), the rounding is to nearest-even, and the destination format requires either two or three digits of scale.

In accordance with an embodiment, if it is determined that the fast-path function can be applied, then a decision is made as to whether rounding-up must be applied, for example, by following the half-even rounding rule, first using an approximated scaled fractional part. As described above, for difficult cases, such as when the approximated scaled fractional part is exactly 0.5 d, the rounding decision can be refined by calculating an exact roundoff on the approximation, and then making the correct rounding decision.

In accordance with an embodiment, under a rounding to nearest-even policy, the returned result is a digit string of a number in decimal format that is closest to the exact numeric value of the binary input value. If two destination format numbers are equally distant, then the one with the last digit even is returned. In accordance with other embodiments, other types of rounding polices can be used.

In accordance with an embodiment, rounding can be performed by reference to a lookup table 158, as described above.

In accordance with an embodiment, the fractional part (i.e., second integer) is then rounded-up 161 as appropriate, including where appropriate propagating the rounding to the integral part 160 (i.e., first integer) in the event of an "all-nine" situation of the scaled fractional part.

In accordance with an embodiment, the digits from the resulting integers representing the integral and fractional parts can then be collected, for example, within a digit buffer 164.

In accordance with an embodiment, the collected digits, required grouping characters (e.g., spaces, commas), and decimal point, can be set on the fly if needed, and the target output, e.g., decimal, representation provided to the software application.

Method for Conversion and Localization of Numeric Values

Figure 7:
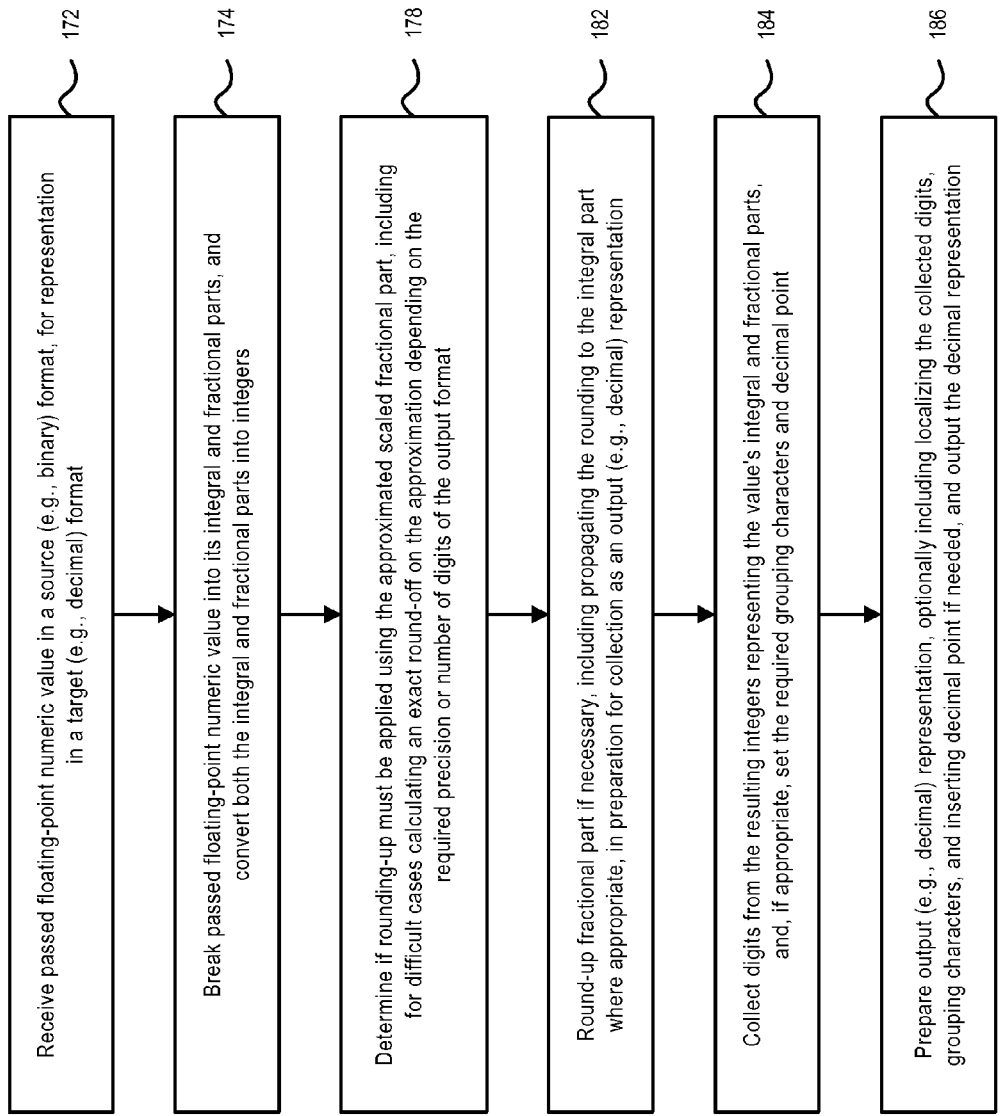
FIG. 7 is a flowchart that illustrates a process for conversion of numeric values stored or received in a source (e.g., binary) format, to corresponding target (e.g., decimal) format representations, in accordance with an embodiment.

FIG. 7 is a flowchart that illustrates a process for conversion of numeric values stored or received in a source (e.g., binary) format, to corresponding target (e.g., decimal) format representations, in accordance with an embodiment.

As shown in FIG. 7, at step 172, the system receives a passed floating-point numeric value in a source (e.g., binary) format, for representation in a target (e.g., decimal) format, for example a floating-point double value in binary format.

At step 174, the passed floating-point numeric value is broken into its integral and fractional parts, and both the integral and fractional parts converted into integers.

At step 178, the system determines if rounding-up should be applied using the approximated scaled fractional parts, including, for difficult cases, calculating an exact roundoff on the approximation depending on the required precision or number of digits of the output format.

At step 182, the fractional part is rounded-up if necessary, including propagating the rounding to the integral part where appropriate, in preparation for collection as an output (e.g., decimal) representation.

At step 184, the digits from the resulting integers representing the value's integral and fractional parts are collected, and, if appropriate, any required grouping characters and decimal point are set.

At step 186, the output representation is prepared, including localizing the collected digits, grouping characters, and inserting a decimal point if needed. The target output (e.g., decimal) representation can then be output or otherwise provided, e.g., to a business application.

Additional Use Cases

Figure 8:
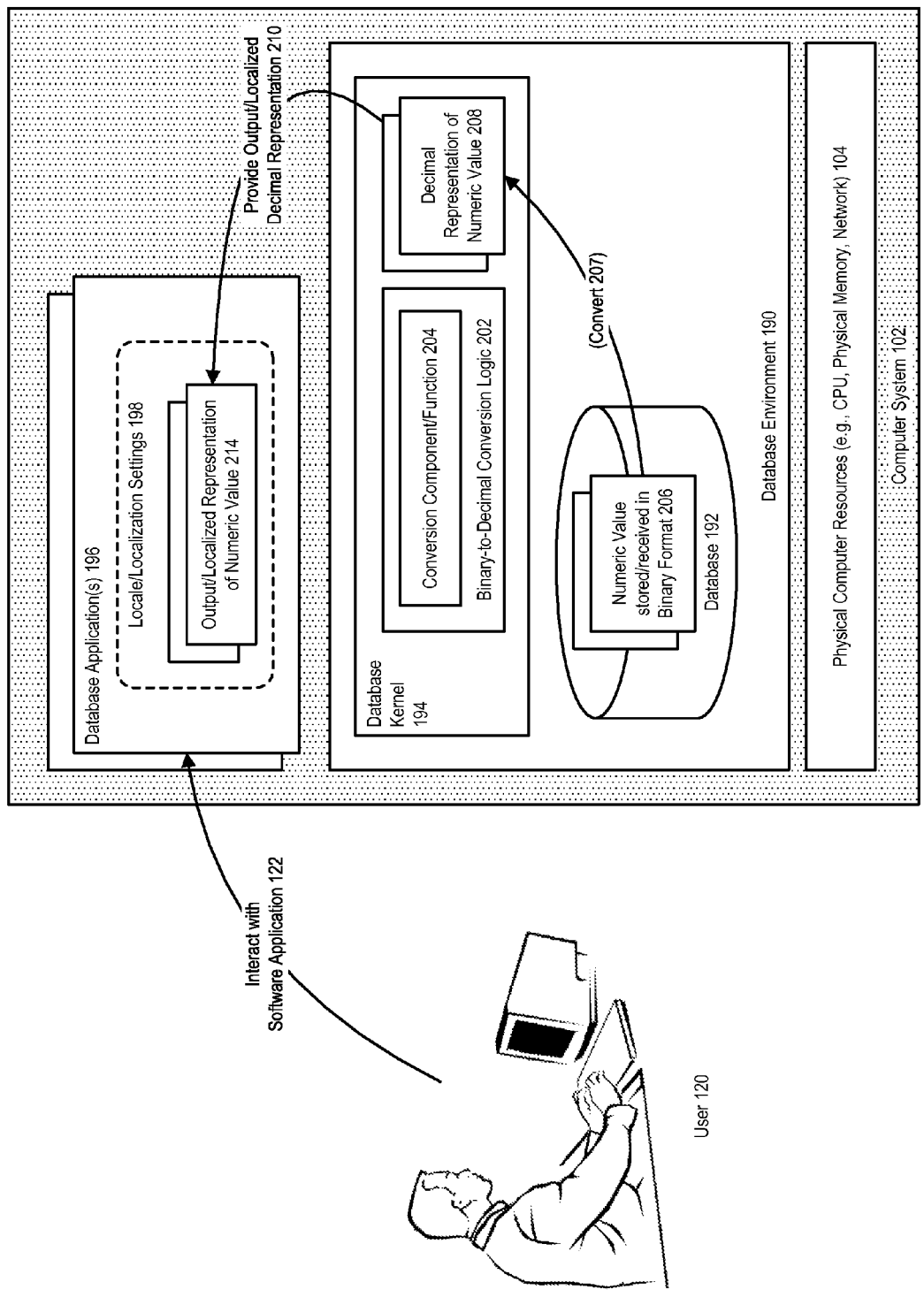
FIG. 8 illustrates an embodiment of a system including a database, which supports conversion of numeric values stored or received in binary format, to corresponding decimal representations, in accordance with an embodiment.

FIG. 8 illustrates an embodiment of a system including a database, which supports conversion of numeric values stored or received in binary format, to corresponding decimal representations, in accordance with an embodiment.

In accordance with various embodiments, the systems and methods described herein can be used within a software development kit, such as a Java Development Kit, for use in developing Java software applications that can then perform the conversion of numeric values from their binary to decimal representations as described herein. The systems and methods described herein can also be used with other software languages or environments such as, for example, in C/C++ application environments, or within a database kernel for use in conversion of numeric values within a database from their binary to decimal representations.

For example, as illustrated in FIG. 8, in accordance with an embodiment, the method of converting data between different number bases can be used within a database environment 190, having a database 192 and a database kernel 194, to perform conversion of numeric values stored or received in a binary format within the database, to corresponding decimal representations for use, for example, by database or other applications 196, and optionally according to a particular locale or localization settings 198 associated with the software application. In accordance with an embodiment, as the software application runs, a binary-to-decimal conversion logic 202 and conversion function 204, operating similar to that described above, can be used with one or more numeric values stored or received within the database in a binary format 206, to convert 207 those numeric values to corresponding decimal representations 208, for output 210 or other use 214 with the software application.

Embodiments of the present invention can be conveniently implemented using one or more conventional general purpose or specialized digital computer, computing device, machine, or microprocessor, including one or more processors, memory and/or computer readable storage media programmed according to the teachings of the present disclosure. Appropriate software coding can readily be prepared by skilled programmers based on the teachings of the present disclosure, as will be apparent to those skilled in the software art.

In some embodiments, the present invention includes a computer program product which is a non-transitory storage medium or computer readable medium (media) having instructions stored thereon/in which can be used to program a computer to perform any of the processes of the present invention. Examples of the storage medium can include, but is not limited to, any type of disk including floppy disks, optical discs, DVD, CD-ROMs, microdrive, and magnetooptical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The foregoing description of embodiments of the present invention has been provided for the purposes of illustration and description. It is not intended to be exhaustive or to limit the invention to the precise forms disclosed. Many modifications and variations will be apparent to the practitioner skilled in the art.

For example, while many of the examples described above illustrate the techniques as used to support conversion between binary and decimal number base formats, in accordance with various embodiments, the techniques can be similarly used to convert numeric values between different or other number base formats, for example between binary and base-5 formats, or between decimal and hexadecimal formats. Similarly, while many of the examples described above illustrate use of a round to nearest-even policy, in accordance with various embodiments, similar techniques can be used with other rounding policies.

Additionally, while various embodiments and examples described above illustrate binary-to-decimal conversion in the context of an OpenJDK Java environment and the use of DecimalFormat, including the optional addition of prefixes and/or suffixes, and localization of the output format, in accordance with various embodiments, the binary-to-decimal conversion techniques described above can be used with other environments that do not require, e.g., setting of prefixes/suffixes, or localization.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalents.

What is claimed is:

1. A system for conversion of a numeric value stored or received in a source number base format to a target number base format for display to a user of a software application the system comprising:
   a computer including a processor, a memory, and conversion logic including a conversion function, wherein the computer is configured by the conversion logic to perform steps comprising,
   receiving a passed numeric value in the source number base format,
   accessing a stored setting of the software application to determine a required precision or number of digits of an output representation,
   converting an integral part of the passed numeric value to a first integer,
   converting a fractional part of the passed numeric value to a second integer while limiting isolation and conversion of the fractional part to the required precision or number of digits,
   performing a rounding process by taking a rounding decision on the second integer representing the fractional part of the passed numeric value, and determining whether to propagate the rounding to the first integer representing the integral part of the passed numeric value, wherein the rounding process is not controlled by the stored application setting,
   collecting digits from the resulting first and second integers representing the integral and fractional parts, and preparing an output representation of the passed numeric value in the target number base format; and
   providing the output representation of the passed numeric value having the required precision or number of digits, and in the target number base format to the software application for display to the user.

2. The system of claim 1, wherein the source number base format is binary format, and the target number base format is decimal format.

3. The system of claim 1, wherein the required precision or number of digits is determined by particular requirements of the software application that will use the output representation.

4. The system of claim 1, wherein the rounding of the fractional part of the passed numeric value is performed using a lookup table.

5. The system of claim 1, wherein the passed numeric value is localized or otherwise prepared for output representation according to the requirements of the software application and a particular target locale.

6. The system of claim 1, wherein the system is provided with a software development kit, for use in developing software applications, wherein the software development kit includes the conversion function.

7. The system of claim 1, wherein the system is provided within a database environment, for use in converting numeric values stored or received in a binary format, to corresponding decimal representations, within a database kernel.

8. The system of claim 1, wherein the converting the fractional part of the passed numeric value further includes, prior to taking the rounding decision on the second integer representing the fractional part,
   scaling up the fractional part by a power of the target number base format.

9. The system of claim 8, wherein the exact roundoff on the fractional part is determined using a fast two sum approximation.

10. The system of claim 1, wherein the target number base format is decimal and wherein the converting the fractional part of the passed numeric value further includes, prior to taking the rounding decision on the second integer representing the fractional part,
    scaling up the fractional part by a power of the target decimal base format, and for instances in which an approximated scaled fractional part is exactly 0.5 decimal, determining an exact roundoff on the fractional part of the passed numeric value.

11. The system of claim 1, wherein the rounding of the fractional part of the passed numeric value is performed using a nearest-even rounding mode.

12. The system of claim 1, wherein the converting of the integral part of the passed numeric value to the first integer, and the converting of the fractional part of the passed numeric value to the second integer is performed in parallel.

13. The system of claim 1, wherein isolation and conversion of the fractional part of the passed numeric value is performed by scaling the fractional part using a floating-point multiply operation.

14. A method for conversion of a numeric value stored or received in a source number base format, to a corresponding representation in a target number base format for display to a user by a software application, the method comprising:
    receiving a passed numeric value in the source number base format;

accessing a stored setting of the software application to determine a required precision or number of digits of an output representation;

converting an integral part of the passed numeric value to a first integer;

converting a fractional part of the passed numeric value to a second integer while limiting isolation and conversion of the fractional part to the required precision or number of digits;

performing a rounding process, as part of said converting of the fractional part of the passed numeric value, by taking a rounding decision on the second integer representing the fractional part of the passed numeric value, and determining whether to propagate the rounding to the first integer representing the integral part of the passed numeric value, wherein the rounding process is not controlled by the stored application setting;

collecting digits from the resulting first and second integers representing the integral and fractional parts and preparing an output representation of the passed numeric value in the target number base format; and providing the output representation of the passed numeric value having the required precision or number of digits, and in a target number base format to the software application for display to the user.

15. The method of claim 14, wherein the source number base format is binary format, and the target number base format is decimal format.

16. The method of claim 14, wherein the required precision or number of digits is determined by particular requirements of said software application that will use the output representation.

17. The method of claim 14, further comprising performing the rounding of the fractional part of the passed numeric value using a lookup table.

18. The method of claim 14, wherein the passed numeric value is localized or otherwise prepared for output representation according to the requirements of a software application and a particular target locale.

19. The method of claim 14, wherein the method is performed by a function of a software development kit, for use in developing software applications that then perform the steps of conversion of the passed numeric value stored or received in the source number base format to the corresponding representation in the target number base format.

20. The method of claim 14, wherein the method is performed within a database environment, for use in converting numeric values stored or received in a binary format, to corresponding decimal representations, within a database kernel.

21. The method of claim 14, wherein the converting the fractional part of the passed numeric value further includes, prior to taking the rounding decision on the second integer representing the fractional part, scaling up the fractional part by a power of the target number base format.

22. The method of claim 14, wherein the target number base format is decimal and wherein the converting the fractional part includes, for instances in which an approximated scaled fractional part is exactly 0.5 decimal, then, prior to taking the rounding decision, determining an exact roundoff on the fractional part.

23. The method of claim 22, wherein the exact roundoff on the fractional part is determined using a fast two sum approximation.

24. The method of claim 14, including performing the rounding of the fractional part of the passed numeric value using a nearest-even rounding mode.

25. The method of claim 14, wherein the converting of the integral part of the passed numeric value to the first integer, and the converting of the fractional part of the passed numeric value to the second integer is performed in parallel.

26. The method of claim 14, wherein isolation and conversion of the fractional part of the passed numeric value is performed by scaling the fractional part using a floating-point multiply operation.

27. A non-transitory computer readable storage medium, including instructions stored thereon for conversion of a numeric value stored or received in a source number base format, to a corresponding representation in a target number base format for display to a user by a software application, which instructions, when read and executed by one or more computers cause the one or more computers to perform steps comprising:

receiving a passed numeric value in a source number base format;

accessing a stored setting of the software application to determine a required precision or number of digits of an output representation;

converting an integral part of the passed numeric value to a first integer;

converting a fractional part of the passed numeric value to a second integer while limiting isolation and conversion of the fractional part to the required precision or number of digits;

performing a rounding process, as part of said converting of the fractional part of the passed numeric value, by taking a rounding decision on the second integer representing the fractional part of the passed numeric value, and determining whether to propagate the rounding to the first integer representing the integral part of the passed numeric value, wherein the rounding process is not controlled by the stored application setting;

collecting digits from the resulting first and second integers representing the integral and fractional parts, and preparing an output representation of the passed numeric value in a target number base format; and providing the output representation of the passed numeric value having the required precision or number of digits, and in a target number base format to the software application for display to the user.

* * * * *